(12) United States Patent
Sinipete et al.

(10) Patent No.: US 11,798,622 B2
(45) Date of Patent: *Oct. 24, 2023

(54) REFRESH OPERATION OF A MEMORY CELL

(71) Applicant: Micron Technology, Inc., Boise, ID (US)

(72) Inventors: Joemar Sinipete, Boise, ID (US); John Christopher Sancon, Boise, ID (US); Mingdong Cui, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/865,248

(22) Filed: Jul. 14, 2022

(65) Prior Publication Data

US 2022/0415395 A1 Dec. 29, 2022

Related U.S. Application Data

(63) Continuation of application No. 15/931,131, filed on May 13, 2020, now Pat. No. 11,404,120.

(51) Int. Cl.
*G11C 11/00* (2006.01)
*G11C 13/00* (2006.01)

(52) U.S. Cl.
CPC ...... *G11C 13/0097* (2013.01); *G11C 13/0004* (2013.01); *G11C 13/004* (2013.01); *G11C 13/0033* (2013.01); *G11C 13/0069* (2013.01); *G11C 2013/0045* (2013.01); *G11C 2013/0078* (2013.01)

(58) Field of Classification Search
CPC ........... G11C 13/0097; G11C 13/0004; G11C 13/0033; G11C 13/004
USPC ........................................................ 365/163
See application file for complete search history.

(56) References Cited

U.S. PATENT DOCUMENTS

| 10,269,442 | B1 | 4/2019 | Tortorelli et al. |
| 11,139,016 | B1 | 10/2021 | Pellizzer et al. |
| 2004/0042310 | A1* | 3/2004 | Nam ................. G11C 11/40603 365/222 |
| 2006/0158948 | A1 | 7/2006 | Fuji |
| 2009/0244962 | A1 | 10/2009 | Gordon et al. |

(Continued)

OTHER PUBLICATIONS

International Search Report and Written Opinion received for PCT Patent Application No. PCT/US21/30424, dated Aug. 24, 2021, 9 pages.

(Continued)

*Primary Examiner* — Vu A Le
(74) *Attorney, Agent, or Firm* — Holland & Hart LLP

(57) ABSTRACT

Methods, systems, and devices for a refresh operation of a memory cell are described. A memory device may include a plurality of rows of memory cells. Each row of memory cells may undergo a quantity of access operations (e.g., read operations, write operations). During a read operation, a logic state of one or more memory cells may be determined by applying a read pulse having a first polarity. Based on the one or more memory cells storing a particular logic state (e.g., a first logic state), a refresh operation may be performed. During a refresh operation, a refresh pulse having a second polarity (e.g., a different polarity than the first polarity) may be applied to the one or more memory cells.

20 Claims, 7 Drawing Sheets

(56) References Cited

U.S. PATENT DOCUMENTS

| | | |
|---|---|---|
| 2013/0336051 A1 | 12/2013 | Jurasek et al. |
| 2017/0125097 A1 | 5/2017 | Tortorelli et al. |
| 2019/0043580 A1 | 2/2019 | Pirovano et al. |
| 2021/0264972 A1 | 8/2021 | Tortorelli et al. |

OTHER PUBLICATIONS

U.S. Appl. No. 16/797,432, by Tortorelli et al., filed Feb. 21, 2020 (54 pages).
U.S. Appl. No. 16/842,524, by Pellizzer et al., filed Apr. 7, 2020 (60 pages).

* cited by examiner

REFRESH OPERATION OF A MEMORY CELL

CROSS REFERENCE

The present Application for Patent is a continuation of U.S. patent application Ser. No. 15/931,131 by Sinipete et al., entitled "REFRESH OPERATION OF A MEMORY CELL," filed May 13, 2020, assigned to the assignee hereof, and is expressly incorporated by reference in its entirety herein.

BACKGROUND

The following relates generally to one or more memory systems and more specifically to a refresh operation of a memory cell.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

A memory device may include a plurality of memory cells that are arranged in one or more rows (e.g., rows of memory cells). The memory cells within any one row may be accessed (e.g., read from, written to) over a period of time. The logic state stored by any one memory cell may be based on its voltage distribution and based on a polarity of a read pulse applied during a read operation. In some examples, when a memory cell has been read a relatively large quantity of times, particular distributions may shift (e.g., move towards a different distribution associated with a different logic state). For example, memory cells programmed to a first logic state may be susceptible to this unintentional shift, which may increase the likelihood of an error occurring during a read operation. Periodically refreshing the memory cell may reduce or minimize the likelihood of such errors.

A memory device configured to perform a refresh operation on one or more memory cells is described herein. The memory device may include a controller (or other logic) configured to determine a logic state of a memory cell. The logic state of a memory cell may be determined by applying a pulse (e.g., a read pulse) to the memory cell. Based on the polarity of the read pulse, the memory cell may (or may not) experience a thresholding event (e.g., a snapback event). The occurrence or non-occurrence of the thresholding event may indicate whether the memory cell is programmed to a first logic state (e.g., a RESET state) or a second logic state (e.g., a SET state).

When it is determined that a memory cell is programmed to the first logic state, a refresh operation may be performed to reinforce the logic state programmed to the cell. A refresh operation may entail applying a pulse (e.g., a refresh pulse) having an opposite polarity as the read pulse. In some examples, a refresh pulse may be applied each time it is determined that a memory cell is programmed to the first logic state or based on a quantity of access operations performed on the cell. When the refresh pulse is applied, the first logic state may be reinforced, which may mitigate any unintentional shifting of the voltage distribution of the memory cell. Further, reinforcing the logic state programmed to the memory cell may reduce the likelihood that the logic state of the memory cell is incorrectly sense during a subsequent read operation.

Features of the disclosure are initially described in the context of memory systems, dies, and arrays as described with reference to FIGS. 1-3. Features of the disclosure are described in the context of timing diagrams as described with reference to FIGS. 4A and 4B. These and other features of the disclosure are further illustrated by and described with reference to an apparatus diagram and flowcharts that relate to a refresh operation of a memory cell as described with references to FIGS. 5-7.

Figure 1:
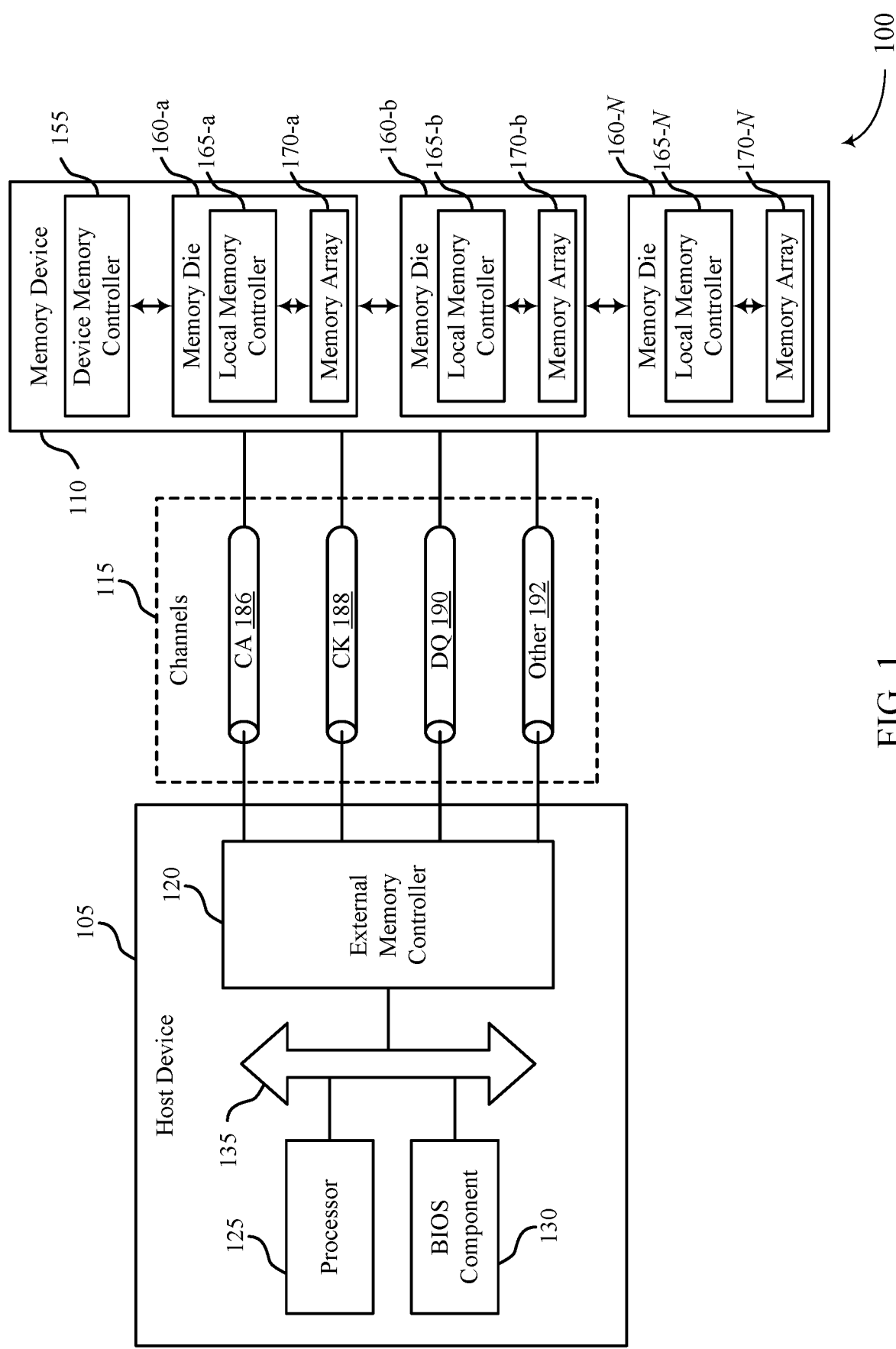
FIG. 1 illustrates an example of a system that supports a refresh operation of a memory cell in accordance with examples as disclosed herein.

FIG. 1 illustrates an example of a system 100 that supports a refresh operation of a memory cell in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the logic state stored to one or more memory cells of a memory array 170 may be determined for performing a refresh operation. A logic state may be written to the memory cells of a memory array 170 by applying a programming pulse (e.g., a write pulse). The pulse may be applied by a controller such as a device memory controller 155 or local memory controller 165, and may be applied with a first polarity (e.g., a positive polarity) or a second polarity (e.g., a negative polarity). A particular voltage distribution of the memory cells may be set based on the polarity of the programming pulse. During a read operation, a read pulse may be applied (e.g., by the device memory controller 155 or local memory controller 165) with the first polarity or the second polarity. Based on the polarities of the pulses (e.g., the write pulse and read pulse), the logic state stored by a memory cell may be determined.

In some instances, it may be desirable to perform a refresh operation on particular memory cells of a memory array 170. For example, when a memory cell programmed to a particular logic state (e.g., a first logic state) experiences a relatively large quantity of read operations without a write operation, its voltage distribution may shift (e.g., migrate towards a voltage distribution associated with a different logic state). Thus, it may be beneficial to apply a refresh pulse based on a particular logic state of a memory cell, a particular quantity of read operations performed on a memory cell, or both. Performing a refresh operation may mitigate data loss and/or corruption due to the programmed logic states transitioning due to a relatively high quantity of read operations being performed on a memory cell as compared with a low quantity of write operations being performed on the memory cell. Additionally or alternatively, performing refresh operations associated with performing read operations may reduce overall system latency and media management complexity of the memory device 110.

Figure 2:
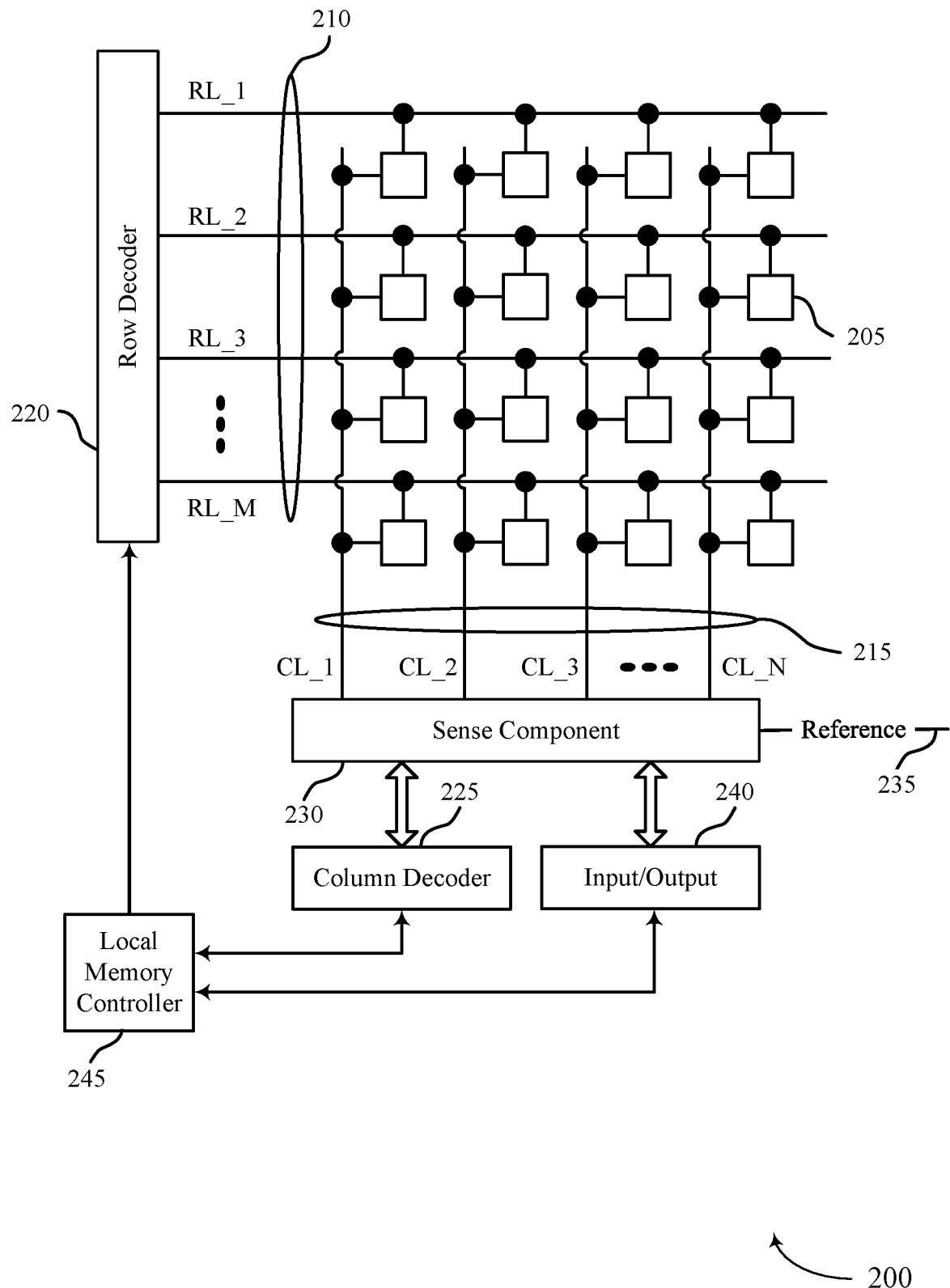
FIG. 2 illustrates an example of a memory die that supports a refresh operation of a memory cell in accordance with examples as disclosed herein.

FIG. 2 illustrates an example of a memory die 200 that supports a refresh operation of a memory cell in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 260 and activate a row line 210 based on the received row address. A column decoder 225 may receive a column address from the local memory controller 260 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 260 may control the accessing of memory cells 205 through the various components (e.g., row decoder 220, column decoder 225, sense component 230). The local memory controller 260 may be an example of the local memory controller 165 described with reference to FIG. 1. In some examples, one or more of the row decoder 220, column decoder 225, and sense component 230 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target row line 210 and the target column line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215) to access the target memory cell 205. The local memory controller 260 may apply a specific signal (e.g., write pulse) to the column line 215 during the write operation to store a specific state in the storage element of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 260 may activate the sense component 230 (e.g., latch the sense component) and thereby compare the signal received from the memory cell 205 to the reference signal 250. Based on that comparison, the sense component 230 may determine a logic state that is stored on the memory cell 205. The pulse used as part of the read operation may include one or more voltage levels over a duration.

In some examples, a refresh operation may be performed on the memory cells 205. As discussed herein, the memory cells 205 may store a logic state based on a programming pulse (e.g., a write pulse) being applied. The programming pulse may be applied by a controller such as a local memory controller 260. The write pulse may be applied with a particular polarity, which may affect the voltage distribution of the memory cell 205. During a read operation, a read pulse may be applied (e.g., by the local memory controller 260) with a particular polarity. Based on the polarities of the pulses (e.g., the write pulse and read pulse), the logic state stored by a memory cell 205 may be determined.

The local memory controller 260 may perform a refresh operation on one or more of the memory cells 205 based on a logic state sensed during a read operation. For example, when a memory cell 205 is programmed to a particular logic state (e.g., a first logic state), its distribution may shift when it experiences a relatively large quantity of read operations without a write operation. The shifting distribution may inadvertently cause a memory cell 205 programmed to a first logic state (e.g., a logic "1") to be sensed as a second logic state (e.g., a logic "0").

By refreshing the memory cell 205, its programmed logic state may be reinforced and less susceptible to being inaccurately determined (e.g., sensed). To refresh the memory cell 205, the local memory controller 260 may apply a refresh pulse having a different polarity than the read command. Applying the refresh pulse with a different polarity may cause the memory cell 205 to experience a snapback event (e.g., a snap), which may reinforce its original state (e.g., the stored state). Reinforcing the original state of the memory cell 205 may mitigate data loss and/or corruption due to the programmed logic state transitioning due to a relatively low quantity of write operations being performed.

Figure 3:
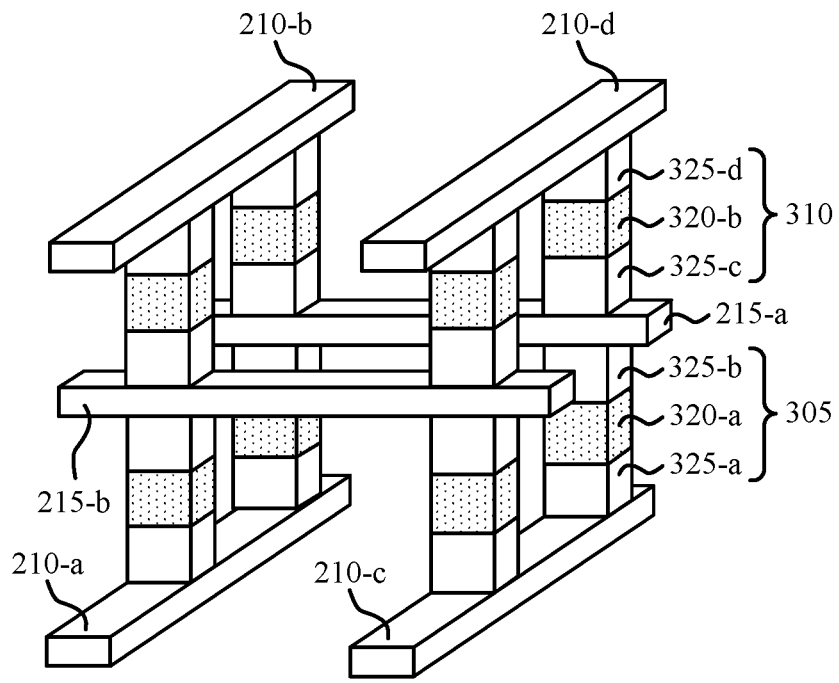
FIG. 3 illustrates an example of memory cells that support a refresh operation of a memory cell in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate and second deck 310 of memory cells on top of the first array or deck 305. Though the example of memory array 300 includes two decks 305, 310, the memory array 300 may include any quantity of decks (e.g., one or more than two).

Memory array 300 may also include a row line 210-a, a row line 210-b, a row line 210-c, a row line 210-d, a column line 215-a, and a column line 215-b, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-a, a storage element 320-a, or an electrode 325-b. One or more memory cells of the second deck 310 may include an electrode 325-c, a storage element 320-b, and an electrode 325-d. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-c of the second deck 310 and the second electrode 325-b of the first deck 305 may be coupled with column line 215-a such that the column line 215-a may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (0), nitrogen (N), chlorine (CO, or fluorine (F), each in atomic or molecular forms.

In some examples, the storage element 320 may be an example of a self-selecting memory cell. In such examples, the material used in the storage element 320 may be based on an alloy (such as the alloys listed above) and may be operated so as to undergo a change to different physical state during normal operation of the memory cell. For example, a self-selecting memory cell may have a high threshold voltage state and a low threshold voltage state. A high threshold voltage state may correspond to a first logic state (e.g., a RESET state) and a low threshold voltage state may correspond to a second logic state (e.g., a SET state). When a memory cell is written to, its logic state may be reinforced such that it may be accurately detected (e.g., sensed). However, when a memory cell experiences relatively few writes over a period of time, its state may slowly shift. For example, if a memory cell is programmed to a high threshold voltage state (e.g., a RESET state) and is written relatively few times over a period of time, the memory cell may slowly shift toward a low threshold voltage. When a quantity of reads are performed over a period of time without a write operation or with relatively few write operations, errors in the data may be introduced by the shift in threshold voltage. Accordingly it may be desirable to periodically issue a read refresh command as described herein to reinforce the state of some memory cells and mitigate the shift of the threshold voltage.

In some examples, such as for thresholding memory cells or self-selecting memory cells, some or all of the set of logic states supported by the memory cells may be associated with an amorphous state of the chalcogenide material (e.g., the material in a single state may be operable to store different logic states). During a programming (write) operation of a self-selecting memory cell (e.g., including electrode 325-a, storage element 320-a, and electrode 325-b), a polarity used for a write operation may influence (determine, set, program) a particular behavior or characteristic of the material of the storage element 320, such as the threshold voltage of the material. The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration).

Figure 4A:
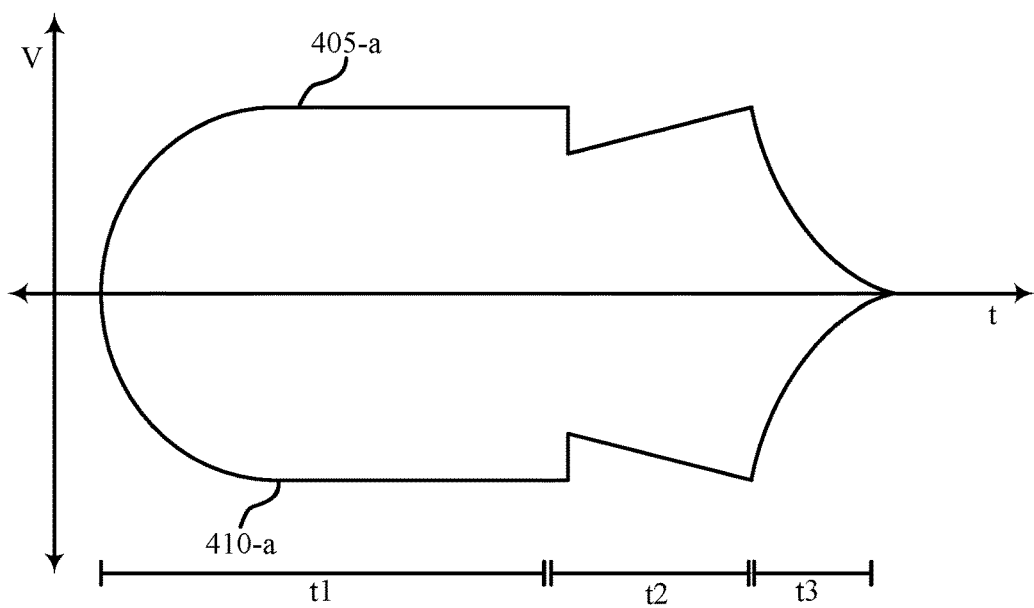
FIGS. 4A and 4B illustrate example timing diagrams that support a refresh operation of a memory cell in accordance with examples as disclosed herein.

FIG. 4A illustrates an example of a timing diagram 400-*a* that supports a refresh operation of a memory cell in accordance with examples as disclosed herein. The timing diagram 400-*a* may illustrate aspects of a read operation performed on a memory cell. In particular, the timing diagram 400-*a* may illustrate voltages applied to a first access line 405-*a* (e.g., a word line) and a second access line 410-*a* (e.g., a bit line). A logic state of the memory cell may be determined based on the voltages applied to the first access line 405-*a* and the second access line 410-*a*, and the voltage distribution of the memory cell set (e.g., programmed) during a write operation.

Prior to the read operation shown in FIG. 4A, a write operation may be performed on a memory cell. To write data to one or more memory cells, a write access bias (e.g., a write pulse, a write voltage) may be applied across the memory cell. For example, a write access bias having a first polarity may be applied to a memory cell to program a SET state. When programming a SET state, the memory cell may experience a high-threshold-to-low-threshold transition which can occur due to a current (e.g., a current associated with a SET state) flowing through the memory cell. In other examples, a write access bias having a second polarity (e.g., a different polarity, an opposite polarity) may be applied to the memory cell to program a RESET state. When programming a RESET state, the memory cell may experience a low-threshold-to-high-threshold transition which can occur due to a current (e.g., a RESET current) flowing through the memory cell. The memory cell associated with the read operation illustrated in FIG. 4A may comprise a SET state (e.g., a second logic state).

When performing a read or write operation, an access bias may be applied across the memory cell. The access bias may be applied across the memory cell by applying a voltage to the first access line 405-*a* and/or second access line 410-*a*. For example, to apply a first access bias (e.g., an access bias having a first polarity) to the memory cell, the first access line 405-*a* may be driven to a relatively high voltage and the second access line 410-*a* may be driven to a relatively low voltage. To apply a second access bias (e.g., an access bias having a second polarity) to the memory cell, the second access line 410-*a* may be driven to a relatively high voltage and the first access line 405-*a* may be driven to a relatively low voltage. As shown in FIG. 4A, the memory cell may have been programmed (e.g., written to) and read using a write access bias having a first polarity.

At t1, a read pulse may be applied to a memory cell. The read pulse may be applied with a first polarity where the first access line 405-*a* is driven to a relatively high voltage and the second access line 410-*a* is driven to a relatively low voltage. In some examples, the access lines may be driven by a controller coupled with one or more voltage sources. For example, the controller may receive a read command (e.g., from a host device) and may initiate applying voltages to the respective access lines. The read pulse may, alternatively, be applied with a second polarity (not shown), which may be a matter of design choice for determining a logic state of a memory cell.

During t1, the voltage of the first access line 405-*a* may increase and the voltage of the second access line 410-*a* may decrease. In some examples, the first access line 405-*a* and the second access line 410-*a* may reach respective threshold voltages and may be maintained at the respective threshold voltages for a duration. When the first access line 405-*a* and the second access line 410-*a* remain at the respective threshold voltages and do not experience a change (e.g., a snapback event), the memory cell may store a first logic state (e.g., a RESET state).

At t2, the memory cell may experience a snapback event based on the read pulse being applied. The snapback event may be characterized by the sudden change of the bias across the memory cell. For example, the snapback event may be illustrated by the decrease in the voltage across the first access line 405-*a* and the increase in the voltage across the second access line 410-*a*, followed by the gradual increase in the voltage across the first access line 405-*a* and the gradual decrease in the voltage across the second access line 410-*a*. The occurrence of the snapback event may indicate that the memory cell is programmed to a second logic state (e.g., a SET state). A memory cell programmed to a SET state may be less susceptible to a shift in its voltage distribution. For example, a memory cell may have a high threshold voltage state and a low threshold voltage state. A low threshold voltage state may correspond to a SET state, and may thus shift less (e.g., shift less towards 0V) than a high threshold state (e.g., a RESET state). Accordingly, when a memory cell is determined to be programmed to a SET state, a memory controller (or other device) may refrain from applying a refresh pulse to the memory cell.

At t3, the read pulse may be removed from the memory cell. When the read pulse is removed, the voltages across the first access line 405-*a* and the second access line 410-*a* may dissipate over the duration of t3. The durations of the intervals t1, t2, and t3 shown in FIG. 4A are for exemplary purposes only. In other examples (not shown), the duration of any of t1, t2, or t3 may be longer or shorter than illustrated.

Figure 4B:
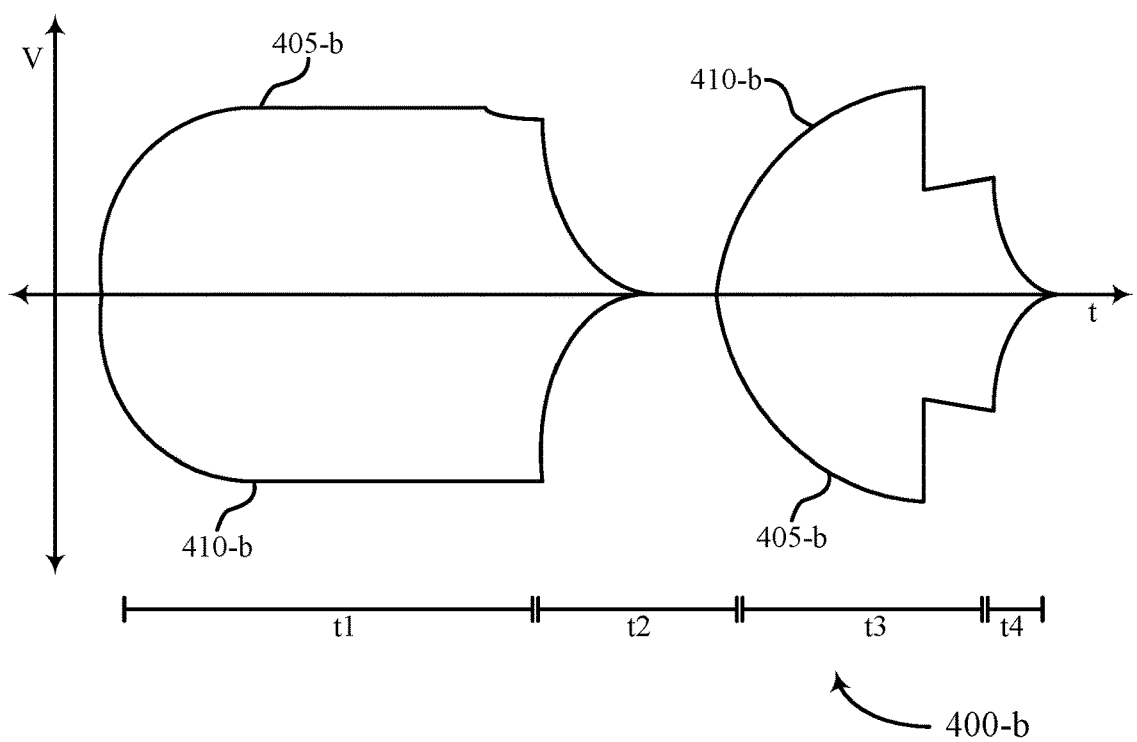

FIG. 4B illustrates an example of a timing diagram 400-*b* that supports a refresh operation of a memory cell in accordance with examples as disclosed herein. The timing diagram 400-*b* may illustrate aspects of a read operation and a refresh operation performed on a memory cell. In particular, the timing diagram 400-*a* may illustrate voltages applied to a first access line 405-*b* (e.g., a word line) and a second access line 410-*b* (e.g., a bit line) during a read operation and a refresh operation. During the read operation, a logic state of the memory cell may be determined based on the voltages applied to the first access line 405-*b* and the second access line 410-*b*, and the voltage distribution of the memory cell set (e.g., programmed) during a write operation. Based on the logic state of the memory cell a refresh pulse may be applied, which may reinforce the programmed logic state of the memory cell.

Prior to the read operation shown in FIG. 4B, a write operation may be performed on a memory cell. As discussed with reference to FIG. 4A, to write data to one or more memory cells, a write access bias (e.g., a write pulse, a write voltage) may be applied across the memory cell. The memory cell associated with the read operation illustrated in FIG. 4B may comprise a RESET state (e.g., a first logic state).

When performing a read or write operation an access bias may be applied across the memory cell. The access bias may be applied across the memory cell by applying a voltage to the first access line 405-*b* and/or second access line 410-*b*. As shown in FIG. 4B, the memory cell may have been programmed (e.g., written to) using a write access bias having a second polarity, read using a read access bias having a first polarity, and refreshed using a refresh access bias having the second polarity.

At t1, a read pulse may be applied to a memory cell. The read pulse may be applied with a first polarity where the first access line 405-*b* is driven to a relatively high voltage and the second access line 410-*b* is driven to a relatively low voltage. In some examples, the access lines may be driven by a controller coupled with one or more voltage sources. For example, the controller may receive a read command (e.g., from a host device) and may initiate applying voltages to the respective access lines. The read pulse may, alternatively, be applied with a second polarity (not shown), which may be a matter of design choice for determining a logic state of a memory cell.

During t1, the voltage of the first access line 405-*b* may increase and the voltage of the second access line 410-*b* may decrease. In some examples, the first access line 405-*b* and the second access line 410-*b* may reach respective threshold voltages and may be maintained at the respective threshold voltages for a duration. When the first access line 405-*b* and the second access line 410-*b* remain at the respective threshold voltages and do not experience a change (e.g., a snapback event), the memory cell may store a first logic state (e.g., a RESET state).

During t1 the memory cell may not experience a snapback event based on the read pulse being applied. Instead, the voltages across the first access line 405-*b* and 410-*b* may remain relatively unchanged. The non-occurrence of the snapback event may indicate that the memory cell is programmed to a first logic state (e.g., a RESET state). A memory cell programmed to a RESET state may be susceptible to a shift in its voltage distribution. Accordingly, when a memory cell is determined to be programmed to a RESET state, a memory controller (or other device) may apply a refresh pulse to the memory cell.

At t2, the read pulse may be removed from the memory cell. When the read pulse is removed, the voltages across the first access line 405-*b* and the second access line 410-*b* may dissipate over the duration of t2. Once the read pulse is removed (or the voltages across the first access line 405-*b* and 410-*b* are negligible), a refresh pulse may be applied to the memory cell.

At t3, a refresh pulse may be applied to the memory cell. The read pulse may be applied with the second polarity where the second access line 410-*b* is driven to a relatively high voltage and the first access line 405-*b* is driven to a relatively low voltage. The refresh pulse may be applied by a controller coupled with the voltage sources described herein. For example, the controller may receive a refresh command (e.g., from a host device) and may initiate applying voltages to the respective access lines. In some examples, each of the write pulse, the read pulse, and the refresh pulse may have (e.g., be applied with) different magnitudes. For example, the read pulse may have a first magnitude, the write pulse may have a second magnitude different than the first magnitude, and the refresh pulse may have a third magnitude different than the first magnitude and the second magnitude.

Additionally or alternatively, the write pulse, the read pulse, and the refresh pulse may be applied with different polarities. For example, the refresh pulse may be applied with a first polarity (not shown), which may be a matter of design choice for determining a logic state of a memory cell. In such an example, the write pulse may also be applied with a first polarity, such that when the read pulse is applied a snapback event occurs. When using such polarities, the detection of a snapback event may indicate that the memory cell is programmed to a RESET state, which may indicate that the memory cell may undergo a refresh operation.

During t3, the voltage of the second access line 410-*b* may increase and the voltage of the first access line 405-*a* may decrease. In some examples, the first access line 405-*a* and the second access line 410-*a* may reach respective threshold voltages, and the memory cell may experience a snapback event. The snapback event may be characterized by decrease in the voltage across the second access line 410-*b* and the increase in the voltage across the first access line 405-*b*, followed by the gradual increase in the voltage across the second access line 410-*b* and the gradual decrease in the voltage across the first access line 405-*b*. The occurrence of the snapback event may reinforce the logic state (e.g., the RESET state) programmed to the memory cell. Reinforcing the logic state of the memory cell may mitigate a shift in the voltage distribution of the memory cell, which may reduce the likelihood of errors occurring when reading (e.g., sensing) the memory cell during subsequent read operations.

In some examples, the frequency at which a refresh operation is performed may be configurable. For example, a refresh operation may be performed each time a read operation is performed on a memory cell programmed to a RESET state. Additionally or alternatively, a refresh operation may be performed after a duration. For example, a refresh operation may be performed on the memory cells programmed to a RESET state after N seconds, where N is a positive real number. Performing refresh operations at such a frequency may increase the overall reliability of the system, but may increase power consumption and latency associated with access operations.

In other examples, the associated memory device may be configured to track a quantity of access operations (e.g., read operations) performed on a memory cell, a row of memory cells, a bank of memory cells, or any quantity of memory cells. Once the quantity of access operations satisfies a threshold quantity, a refresh operation may be performed on the memory cell(s). In some examples, the quantity of access operations may be tracked using a counter, or may be tracked by a controller or other logic of the associated memory device. Performing refresh operations at such this frequency may decrease power consumption and latency associated with access operations relative to performing a refresh operation each time a RESET state is sensed.

In yet another example, the associated memory device may be configured to track a quantity of access operations (e.g., read operations and write operations) performed on a memory cell, a row of memory cells, a bank of memory cells, or any quantity of memory cells. A refresh operation may be performed when the memory cell(s) have undergone a threshold quantity of read operations without a write operation being performed. In some examples, the quantity of access operations may be tracked using a counter, or may be tracked by a controller or other logic of the associated memory device. Performing refresh operations at such this frequency may further decrease power consumption and latency associated with access operations relative to performing a refresh operation after a threshold quantity of read operations are performed.

At t4, the refresh pulse may be removed from the memory cell. When the refresh pulse is removed, the voltages across the first access line 405-*b* and the second access line 410-*b* may dissipate over the duration of t4. The durations of the intervals t1, t2, t3, and t4 shown in FIG. 4B are for exemplary purposes only. In other examples (not shown), the duration of any of t1, t2, t3, or t4 may be longer or shorter than illustrated.

Figure 5:
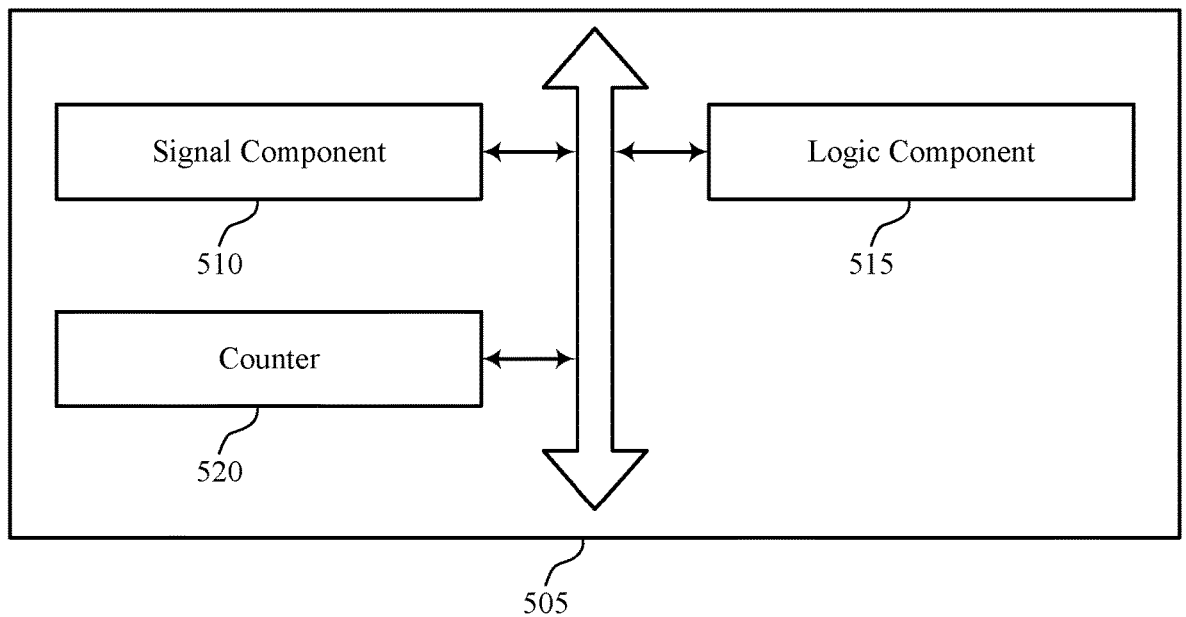
FIG. 5 shows a block diagram of a memory device that supports a refresh operation of a memory cell in accordance with examples as disclosed herein.

FIG. 5 shows a block diagram 500 of a memory device 505 that supports a refresh operation of a memory cell in accordance with examples as disclosed herein. The memory device 505 may be an example of aspects of a memory device as described with reference to FIGS. 1 through 4. The memory device 505 may include a signal component 510, a logic component 515, and a counter 520. Each of these components may communicate, directly or indirectly, with one another (e.g., via one or more buses).

The signal component 510 may apply, to a memory cell, a read pulse having a first polarity to perform a read operation on the memory cell. In some examples, the signal component 510 may apply, to the memory cell, a refresh pulse having the second polarity different than the first polarity based on determining that the memory cell stores the first logic state. In some examples, the signal component 510 may refrain from applying the refresh pulse based on determining that the value of the counter fails to satisfy the threshold.

In some examples, the signal component 510 may apply a first write pulse having the second polarity to the memory cell, where the memory cell includes the first logic state having a first distribution based on applying the first write pulse, where applying the read pulse is based on applying the first write pulse. In some examples, the signal component 510 may apply a second write pulse having the first polarity to the memory cell, where the memory cell includes the second logic state having a second distribution different than the first distribution based on applying the second write pulse.

In some cases, the read pulse includes a first magnitude, the write pulse includes a second magnitude different than the first magnitude, and the refresh pulse includes a third magnitude different than the first magnitude and the second magnitude. In some cases, the first polarity and the second polarity are opposite polarities.

The logic component 515 may determine whether the memory cell stores a first logic state or a second logic state based on applying the read pulse, where the first logic state is associated with a write pulse having a second polarity different than the first polarity of the read pulse. In some examples, the logic component 515 may determine that the memory cell stores the second logic state based on applying the read pulse, where the second logic state is associated with a write pulse having the first polarity. In some examples, the logic component 515 may refrain from applying the refresh pulse based on determining that the memory cell stores the second logic state. In some examples, the logic component 515 may detect a snapback event associated with the memory cell based on applying the read pulse.

In some examples, a device such as a controller (e.g., a local memory controller) may determine whether a value of the counter 520 satisfies a threshold based on the signal component 510 applying the read pulse. The value of the counter may be associated with a quantity of access operations performed on the memory cell. In some examples, applying the refresh pulse is based on determining that the value of the counter satisfies the threshold. In some examples, the counter 520 may be incremented based on applying the read pulse to the memory cell, where determining that the value of the counter satisfies the threshold is based on incrementing.

Figure 6:
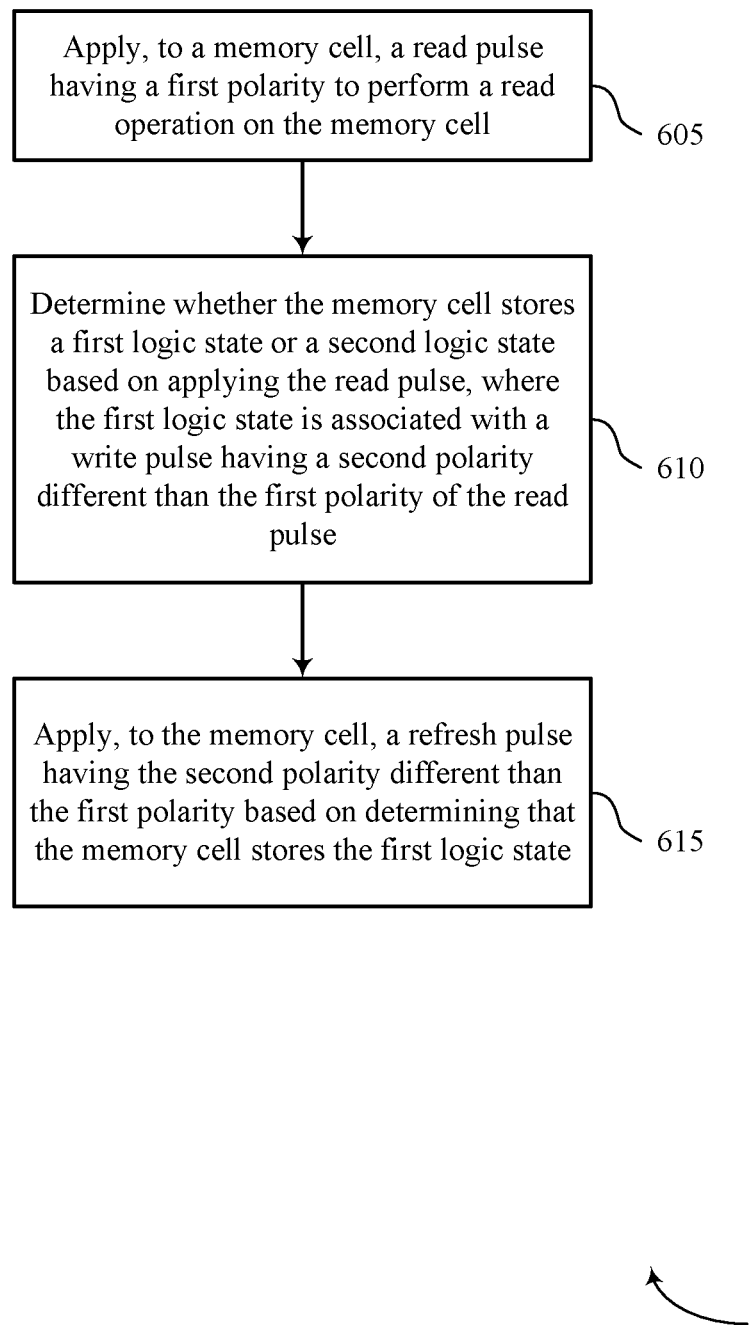
FIGS. 6 and 7 show flowcharts illustrating a method or methods that support a refresh operation of a memory cell in accordance with examples as disclosed herein.

FIG. 6 shows a flowchart illustrating a method or methods 600 that supports a refresh operation of a memory cell in accordance with examples as disclosed herein. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may apply, to a memory cell, a read pulse having a first polarity to perform a read operation on the memory cell. The operations of 605 may be performed according to the methods described herein. In some examples, aspects of the operations of 605 may be performed by a signal component as described with reference to FIG. 5.

At 610, the memory device may determine whether the memory cell stores a first logic state or a second logic state based on applying the read pulse, where the first logic state is associated with a write pulse having a second polarity different than the first polarity of the read pulse. The operations of 610 may be performed according to the methods described herein. In some examples, aspects of the operations of 610 may be performed by a logic component as described with reference to FIG. 5.

At 615, the memory device may apply, to the memory cell, a refresh pulse having the second polarity different than the first polarity based on determining that the memory cell stores the first logic state. The operations of 615 may be performed according to the methods described herein. In some examples, aspects of the operations of 615 may be performed by a signal component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for applying, to a memory cell, a read pulse having a first polarity to perform a read operation on the memory cell, determining whether the memory cell stores a first logic state or a second logic state based on applying the read pulse, where the first logic state is associated with a write pulse having a second polarity different than the first polarity of the read pulse, and applying, to the memory cell, a refresh pulse having the second polarity different than the first polarity based on determining that the memory cell stores the first logic state.

Some examples of the method 600 and the apparatus described herein may further include operations, features, means, or instructions for determining that the memory cell stores the second logic state based on applying the read pulse, where the second logic state may be associated with a write pulse having the first polarity, the method further including.

In some examples of the method 600 and the apparatus described herein, determining whether the memory cell stores the first logic state or the second logic state may include operations, features, means, or instructions for detecting a snapback event associated with the memory cell based on applying the read pulse.

Some examples of the method 600 and the apparatus described herein may further include operations, features, means, or instructions for determining whether a value of a counter associated with access operations performed on the memory cell satisfies a threshold based on applying the read pulse, where applying the refresh pulse may be based on determining that the value of the counter satisfies the threshold.

Some examples of the method 600 and the apparatus described herein may further include operations, features, means, or instructions for incrementing the counter based on applying the read pulse to the memory cell, where determining that the value of the counter satisfies the threshold may be based on incrementing.

Some examples of the method 600 and the apparatus described herein may further include operations, features, means, or instructions for refraining from applying the refresh pulse based on determining that the value of the counter fails to satisfy the threshold.

Some examples of the method 600 and the apparatus described herein may further include operations, features, means, or instructions for applying a first write pulse having the second polarity to the memory cell, where the memory cell includes the first logic state having a first distribution based on applying the first write pulse, where applying the read pulse may be based on applying the first write pulse.

Some examples of the method 600 and the apparatus described herein may further include operations, features, means, or instructions for applying a second write pulse having the first polarity to the memory cell, where the memory cell includes the second logic state having a second distribution different than the first distribution based on applying the second write pulse.

In some examples of the method 600 and the apparatus described herein, the read pulse includes a first magnitude, the write pulse includes a second magnitude different than the first magnitude, and the refresh pulse includes a third magnitude different than the first magnitude and the second magnitude.

In some examples of the method 600 and the apparatus described herein, the first polarity and the second polarity may be opposite polarities.

Figure 7:
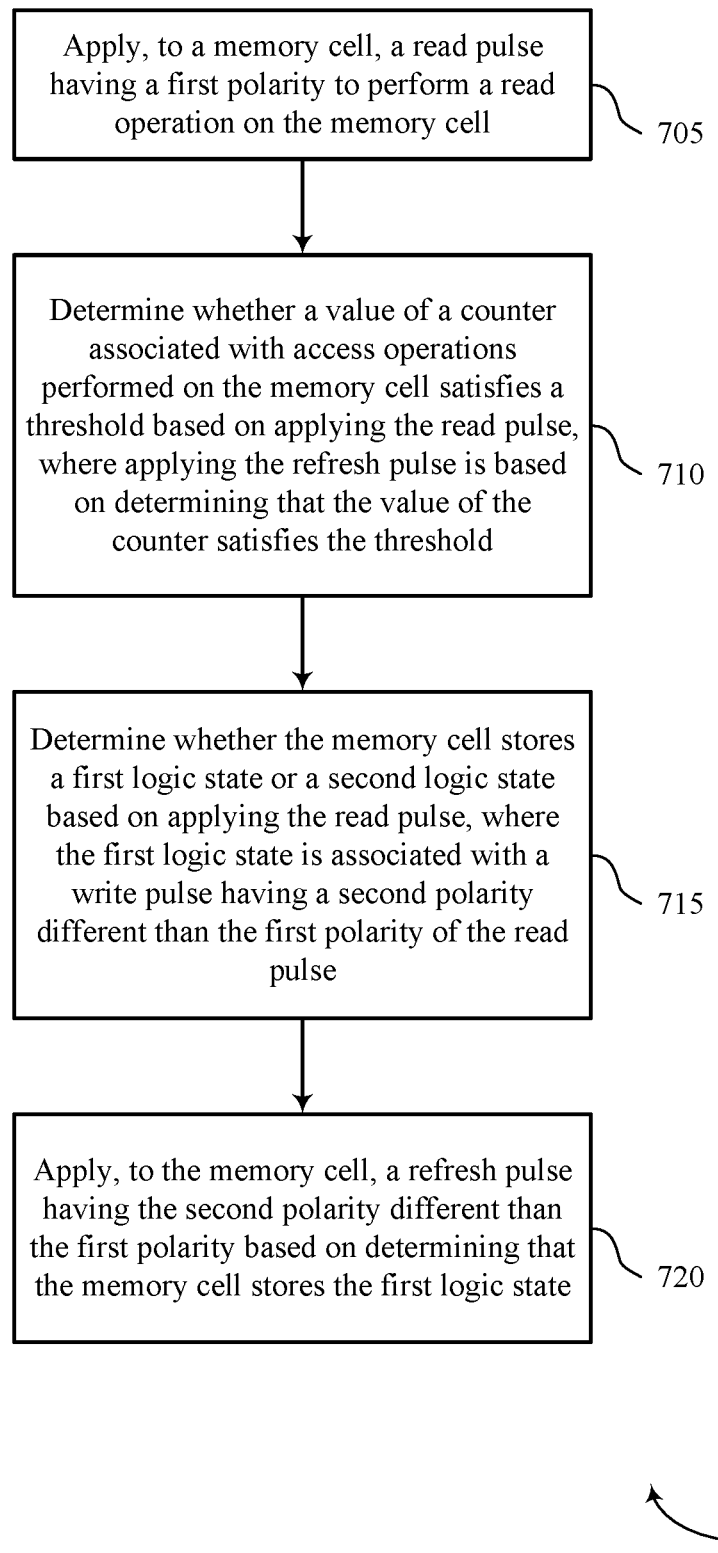

FIG. 7 shows a flowchart illustrating a method or methods 700 that supports a refresh operation of a memory cell in accordance with examples as disclosed herein. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the memory device may apply, to a memory cell, a read pulse having a first polarity to perform a read operation on the memory cell. The operations of 705 may be performed according to the methods described herein. In some examples, aspects of the operations of 705 may be performed by a signal component as described with reference to FIG. 5.

At 710, the memory device may determine whether a value of a counter associated with access operations performed on the memory cell satisfies a threshold based on applying the read pulse, where applying the refresh pulse is based on determining that the value of the counter satisfies the threshold. The operations of 710 may be performed according to the methods described herein. In some examples, aspects of the operations of 710 may be performed by a counter as described with reference to FIG. 5.

At 715, the memory device may determine whether the memory cell stores a first logic state or a second logic state based on applying the read pulse, where the first logic state is associated with a write pulse having a second polarity different than the first polarity of the read pulse. The operations of 715 may be performed according to the methods described herein. In some examples, aspects of the operations of 715 may be performed by a logic component as described with reference to FIG. 5.

At 720, the memory device may apply, to the memory cell, a refresh pulse having the second polarity different than the first polarity based on determining that the memory cell stores the first logic state. The operations of 720 may be performed according to the methods described herein. In some examples, aspects of the operations of 720 may be performed by a signal component as described with reference to FIG. 5.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array including a set of memory cells that each include a chalcogenide storage element, a logic component coupled with the memory array and configured to determine whether a memory cell of the set of memory cells stores a first logic state or a second logic state, and a signal component coupled with the logic component and the memory array, where the signal component is configured to apply a read pulse having a first polarity to one or more memory cells of the set of memory cells and apply a refresh pulse having a second polarity different than the first polarity to the one or more memory cells of the set of memory cells based on the one or more memory cells including the first logic state.

Some examples of the apparatus may include a counter associated with access operations performed on the memory cell and that may be coupled with the signal component, where the counter may be configured to be incremented based on the read pulse being applied to the memory cell, where the refresh pulse may be applied based on whether of a value of the counter satisfies a threshold.

In some examples, the signal component may be configured to refrain from applying the refresh pulse based on the value of the counter being less than the threshold.

In some examples, the logic component may be configured to determine that the memory cell stores the second logic state based on the read pulse being applied, and the signal component may be configured to refrain from applying the refresh pulse based on the memory cell including the second logic state.

In some examples, the logic component may be configured to determine that the memory cell stores the first logic state by detecting a snapback event associated with the memory cell after the read pulse may be applied.

In some examples, the signal component may be configured to apply a first write pulse including the second polarity to the memory cell, where the memory cell includes the first logic state having a first distribution based on the first write pulse being applied.

In some examples, the signal component may be configured to apply a second write pulse including the first polarity to the memory cell, where the memory cell includes the second logic state having a second distribution different than the first distribution based on the second write pulse being applied.

In some examples, the read pulse includes a first magnitude, the write pulse includes a second magnitude different than the first magnitude, and the refresh pulse includes a third magnitude different than the first magnitude and the second magnitude.

An apparatus is described. The apparatus may include a memory array including a set of memory cells that each include a chalcogenide storage element and a controller coupled with the memory array and configured to cause the apparatus to apply, to a memory cell of the memory array, a read pulse having a first polarity to perform a read operation on the memory cell, determine whether the memory cell stores a first logic state or a second logic state based on applying the read pulse, where the first logic state is associated with a write pulse having a second polarity different than the first polarity of the read pulse, and apply, to the memory cell, a refresh pulse having the second polarity different than the first polarity based on determining that the memory cell stores the first logic state.

Some examples may further include determining that the memory cell stores the second logic state based on applying the read pulse, where the second logic state may be associated with a write pulse having the first polarity, and refrain from applying the refresh pulse based on determining that the memory cell stores the second logic state.

Some examples may further include detecting a snapback event associated with the memory cell based on applying the read pulse.

Some examples may further include increment a counter associated with access operations performed on the memory cell based on applying the read pulse to the memory cell, and determining whether a value of the satisfies a threshold based on incrementing the counter, where applying the refresh pulse may be applied based on the value of the counter satisfying the threshold.

Some examples may further include refrain from applying the refresh pulse based on determining that the value of the counter fails to satisfy the threshold.

Some examples may further include apply a first write pulse having the second polarity to the memory cell, where the memory cell includes the first logic state having a first distribution based on applying the first write pulse, where applying the read pulse may be based on applying the first write pulse, and apply a second write pulse including the first polarity to the memory cell, where the memory cell includes the second logic state having a second distribution different than the first distribution based on applying the second write pulse.

In some examples, the first polarity includes a positive polarity or a negative polarity, and where the second polarity includes an opposite polarity of the first polarity.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   applying, to a memory cell, a first pulse having a first polarity;
   determining that the memory cell stores a first logic state based at least in part on applying the first pulse, wherein the first logic state is associated with a second pulse having a second polarity different than the first polarity of the first pulse; and
   applying, to the memory cell for a first duration, a third pulse having the second polarity different than the first polarity based at least in part on determining that the memory cell stores the first logic state, wherein a snapback event associated with the memory cell occurs during the first duration based at least in part on applying the third pulse for the first duration.

2. The method of claim 1, wherein determining that the memory cell stores the first logic state comprises:
   determining that a snapback event associated with the memory cell does not occur based at least in part on applying the first pulse.

3. The method of claim 2, further comprising:
   applying, for a second duration, the first pulse to an access line coupled with the memory cell, wherein the access line is charged to a first voltage based at least in part on applying the first pulse for the second duration;
   determining that the access line maintains the first voltage for the second duration; and
   determining that the memory cell stores the first logic state based at least in part on determining that the access line maintains the first voltage for the second duration.

4. The method of claim 1, further comprising:
   determining whether a value of a counter satisfies a threshold based at least in part on applying the first pulse, wherein applying the third pulse is based at least in part on determining that the value of the counter satisfies the threshold.

5. The method of claim 4, further comprising:
   incrementing the counter based at least in part on applying the first pulse to the memory cell, wherein determining that the value of the counter satisfies the threshold is based at least in part on incrementing the counter.

6. The method of claim 4, further comprising:
   refraining from applying the third pulse for a second time based at least in part on determining that the value of the counter fails to satisfy the threshold, wherein determining whether the value of the counter satisfies the threshold occurs after applying the third pulse.

7. The method of claim 1, further comprising:
applying the second pulse to the memory cell, wherein the memory cell comprises the first logic state having a first distribution based at least in part on applying the second pulse.

8. The method of claim 1, wherein the first pulse comprises a read pulse having a first magnitude, the second pulse comprises a write pulse having a second magnitude, and the third pulse comprises a refresh pulse having a third magnitude.

9. A non-transitory computer-readable medium storing code comprising instructions, which when executed by a processor of an electronic device, cause the electronic device to:
apply, to a memory cell, a first pulse having a first polarity;
determine that the memory cell stores a first logic state based at least in part on applying the first pulse, wherein the first logic state is associated with a second pulse having a second polarity different than the first polarity of the first pulse; and
apply, to the memory cell for a first duration, a third pulse having the second polarity different than the first polarity based at least in part on determining that the memory cell stores the first logic state, wherein a snapback event associated with the memory cell occurs during the first duration based at least in part on applying the third pulse for the first duration.

10. The non-transitory computer-readable medium of claim 9, wherein the instructions to determine that the memory cell stores the first logic state, when executed by the processor of the electronic device, further cause the electronic device to:
determine that a snapback event associated with the memory cell does not occur based at least in part on applying the first pulse.

11. The non-transitory computer-readable medium of claim 10, wherein the instructions, when executed by the processor of the electronic device, further cause the electronic device to:
apply, for a second duration, the first pulse to an access line coupled with the memory cell, wherein the access line is charged to a first voltage based at least in part on applying the first pulse for the second duration;
determine that the access line maintains the first voltage for the second duration; and
determine that the memory cell stores the first logic state based at least in part on determining that the access line maintains the first voltage for the second duration.

12. The non-transitory computer-readable medium of claim 9, wherein the instructions, when executed by the processor of the electronic device, further cause the electronic device to:
determine whether a value of a counter satisfies a threshold based at least in part on applying the first pulse, wherein applying the third pulse is based at least in part on determining that the value of the counter satisfies the threshold.

13. The non-transitory computer-readable medium of claim 12, wherein the instructions, when executed by the processor of the electronic device, further cause the electronic device to:
increment the counter based at least in part on applying the first pulse to the memory cell, wherein determining that the value of the counter satisfies the threshold is based at least in part on incrementing the counter.

14. The non-transitory computer-readable medium of claim 12, wherein the instructions, when executed by the processor of the electronic device, further cause the electronic device to:
refrain from applying the third pulse for a second time based at least in part on determining that the value of the counter fails to satisfy the threshold, wherein determining whether the value of the counter satisfies the threshold occurs after applying the third pulse.

15. The non-transitory computer-readable medium of claim 9, wherein the instructions, when executed by the processor of the electronic device, further cause the electronic device to:
apply the second pulse to the memory cell, wherein the memory cell comprises the first logic state having a first distribution based at least in part on applying the second pulse.

16. The non-transitory computer-readable medium of claim 9, wherein the first pulse comprises a read pulse having a first magnitude, the second pulse comprises a write pulse having a second magnitude, and the third pulse comprises a refresh pulse having a third magnitude.

17. An apparatus, comprising:
means for applying, to a memory cell, a first pulse having a first polarity;
means for determining that the memory cell stores a first logic state based at least in part on applying the first pulse, wherein the first logic state is associated with a second pulse having a second polarity different than the first polarity of the first pulse; and
means for applying, to the memory cell for a first duration, a third pulse having the second polarity different than the first polarity based at least in part on determining that the memory cell stores the first logic state, wherein a snapback event associated with the memory cell occurs during the first duration based at least in part on applying the third pulse for the first duration.

18. The apparatus of claim 17, wherein the means for determining that the memory cell stores the first logic state comprise:
means for determining that a snapback event associated with the memory cell does not occur based at least in part on applying the first pulse.

19. The apparatus of claim 18, further comprising:
means for applying, for a second duration, the first pulse to an access line coupled with the memory cell, wherein the access line is charged to a first voltage based at least in part on applying the first pulse for the second duration;
means for determining that the access line maintains the first voltage for the second duration; and
means for determining that the memory cell stores the first logic state based at least in part on determining that the access line maintains the first voltage for the second duration.

20. The apparatus of claim 17, further comprising:
means for determining whether a value of a counter satisfies a threshold based at least in part on applying the first pulse, wherein applying the third pulse is based at least in part on determining that the value of the counter satisfies the threshold.

* * * * *